United States Patent [19]

Tuska

[11] 4,321,543
[45] Mar. 23, 1982

[54] THREE-CONDITION DISPLAY SYSTEM

[75] Inventor: James W. Tuska, Pennington, N.J.

[73] Assignee: RCA Corporation, New York, N.Y.

[21] Appl. No.: 139,714

[22] Filed: Apr. 14, 1980

[51] Int. Cl.³ .......................................... G01N 27/42
[52] U.S. Cl. .................................. 324/433; 324/133
[58] Field of Search ............... 340/753, 660, 661, 662, 340/663; 324/133, 72.5, 158 P, 433

[56] References Cited

U.S. PATENT DOCUMENTS 4,020,414 4/1977 Paredes .............................. 324/433
4,163,935 8/1979 Sakurada ............................ 324/133

Primary Examiner—Michael J. Tokar
Attorney, Agent, or Firm—Samuel Cohen; Robert L. Troike; Raymond E. Smiley

[57] ABSTRACT

Apparatus for detecting and displaying a high, normal, or low condition of battery voltage or engine temperature in an automobile by energizing an H, a dash, or an L, respectively, on a 7-segment display device. A voltage representing the condition is compared with upper and lower threshold voltages in comparators. Outputs of the comparators are applied through inverting and noninverting transistors to specific segments of the display unit. An input voltage above the lower threshold energizes the middle horizontal segment which displays a dash representing a normal condition. An input voltage above the upper threshold energizes the vertical segments to complete the display of an H representing a high condition.

7 Claims, 3 Drawing Figures

| INPUT VOLTAGE | $C_1$ | $Q_1$ | $C_2$ | $Q_2$ | $Q_3$ | DISPLAY |
|---|---|---|---|---|---|---|
| OVER 7 v. | LO ↑ | ON ↑ | HI | ON | OFF | ┌┐ |
| 5.7 - 7 v. | HI | OFF | HI ↓ | ON ↓ | OFF ↓ | — |
| UNDER 5.7 v. | HI | OFF | LO | OFF | ON | └ |

THREE-CONDITION DISPLAY SYSTEM

This invention relates to a three-condition detection and display system for detecting and displaying three conditions, such as: high voltage, normal voltage and low voltage in the electrical system of an automobile, and/or hot temperature, normal temperature and cold temperature in the engine cooling system of an automobile.

Not many years ago, automobiles were almost all provided with a voltmeter and a thermometer for indicating the voltage of the electrical system and the temperature of the engine. Presently, most automobiles are provided with a red light which comes on when the voltage is too low, and a red light which comes on when the engine temperature is too high. The red "idiot" lights, employed for reasons of economy, do not provide the motorist with as much information as he needs about the voltage and temperature in the automobile. Accordingly, there is a need for an inexpensive three-condition detection and display apparatus which will indicate high, normal and low values of voltage, temperature or other conditions in the automobile.

According to an example of the invention, first and second comparators are receptive to an upper threshold voltage, a voltage representing a condition to be displayed, and a lower threshold voltage. Inverting and non-inverting circuits couple outputs of the comparators to energize high-indicating, normal-indicating and low-indicating segments of a seven-segment display.

Figures 1, 2:
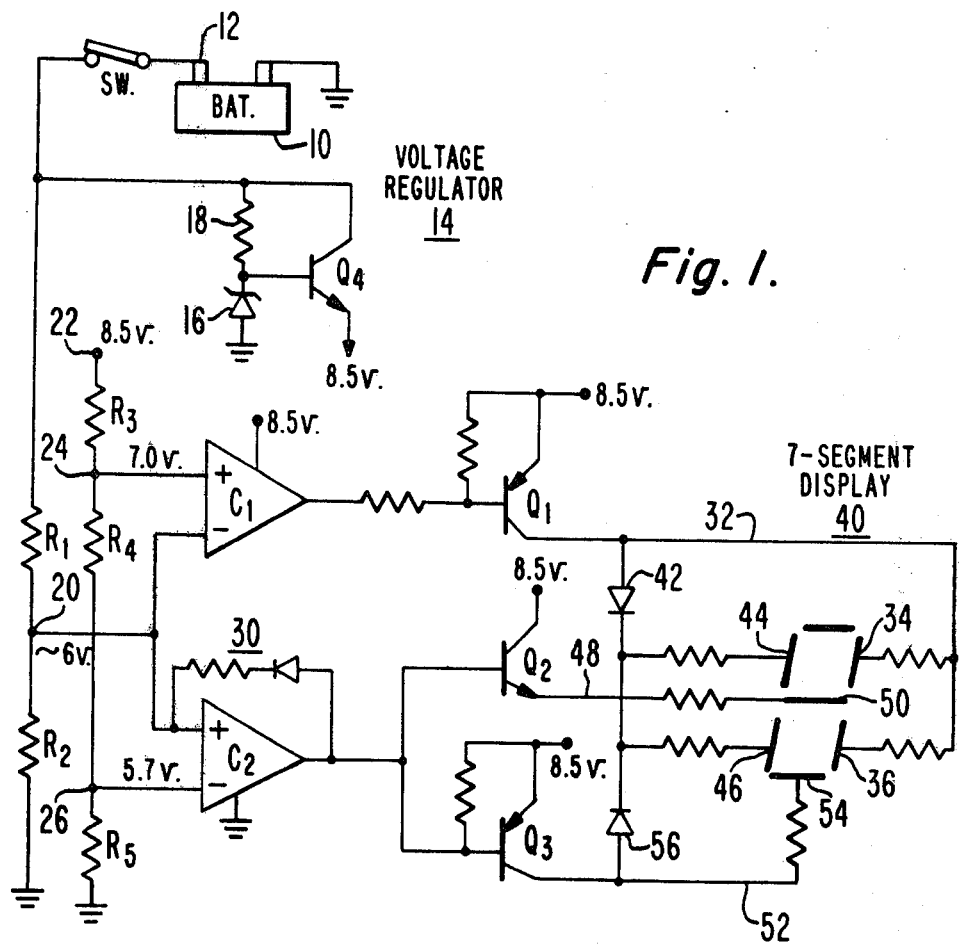
FIG. 1 is a circuit diagram of a three-condition detection and display apparatus constructed according to the teachings of the invention.
FIG. 2 is a chart of voltage states which will be referred to in describing the operation of the apparatus of FIG. 1.

Reference is now made in greater detail to FIG. 1 in which the positive terminal 12 of a 12-volt battery 10 is connected through an ignition switch SW to a voltage regulator 14 which provides an output voltage of 8.5 volts. The 12-volt battery, used in the present example, may have a normal voltage of 12.3 volts, and may have a much lower voltage due to being discharged, or a much higher voltage due to being charged from the engine alternator. The voltage regulator 14 is of conventional construction in including a 9-volt zener diode 16 and a transistor $Q_4$ connected as shown in circuit with a 390-ohm resistor 18.

The battery terminal 12 is also connected to a voltage divider $R_1$, $R_2$ having a tap 20 providing a voltage which is a fixed proportion, such as one-half, of the voltage at battery terminal 12. The circuit to be described provides a three-condition display of the voltage battery terminal 12. The voltage regulator 14 supplies a lower constant voltage of 8.5 volts from the emitter of its transistor $Q_4$ to the detection and display circuit despite changes in the battery voltage so long as the battery voltage is above about 9 volts.

The 8.5 volts from voltage regulator 14 is connected by a wire (not shown) to the terminal 22 of a voltage divider $R_3$, $R_4$ and $R_5$. The resistors have values, in the present example, so that a tap 24 has a voltage of 7 volts which is connected as an upper threshold voltage to a first comparator $C_1$, and a tap 26 has a voltage of 5.7 volts which is connected as a lower threshold to a second comparator $C_2$. Both comparators also receive battery voltage input signals from tap 20 on voltage divider $R_1$, $R_2$ for comparison with the threshold voltages. In the present example, a normal battery potential of 12.5 volts appears at tap 20 as a potential of about 6 volts since $R_1$ and $R_2$ have values of 4.64 K and 4.22 K.

Comparators $C_1$ and $C_2$ may be two of the four comparators in a Type CA339 integrated circuit unit made by RCA Corporation. All comparators are internally connected to a terminal shown on comparator $C_1$ for receiving 8.5 volts from regulator 14, and a terminal shown on comparator $C_2$ for connection to ground. Comparator $C_2$ is provided with a feedback circuit 20 which makes the comparator operate in the manner of a Schmitt trigger to provide a hysteresis effect. That is, when the input signal to the + input of the comparator increases and exceeds the − reference inputs, a small part of the resulting high output of the comparator is fed back to the input so that a small decrease in the input signal cannot switch the output low to cause a flickering of the display.

The output of comparator $C_1$ is coupled to the base input of a PNP signal-inverting transistor $Q_1$ having its collector electrode connected over line 32 and respective resistors to vertical segments 34 and 36 of a 7-segment display device 40, and through isolating diode 42 and respective resistors to vertical segments 44 and 46. The 7-segment display 40 may be a commerically-available unit of the light-emitting-diode, the liquid crystal, the incadescent, or the vacuum flourescent type. The display 40 has a common electrode (not shown) connected ower a power supply return path to ground, or to a point of variable voltage by which the intensity of the display can be varied. The output of comparator $C_2$ is connected to the base input of an NPN non-inverting transistor $Q_2$ having its emitter connected over line 48 and a resistor to the middle horizontal segment 50 of the display 40. It may be noted that when high outputs are provided by transistors $Q_1$ and $Q_2$, all of segments 34, 36, 44, 46 and 50 are energized to display an "H", representing "high" battery voltage. When there is a high output from solely the transistor $Q_2$, the segment 50 is energized to display a dash "—" representing a "normal" battery voltage.

The output of comparator $C_2$ is also connected to the base input of a PNP signal-inverting transistor $Q_3$ having its collector electrode connected over line 52 to the lower horizontal segment 54 of display 40, and through isolating diode 56 and respective resistors to vertical segments 44 and 46 of the display. It may be noted that when there is a high output from solely transistor $Q_3$, the segments 44, 46 and 54 are energized to display an "L" representing a "low" battery voltage.

Transistors $Q_1$ and $Q_3$ may be Type 2N4126, and transistors $Q_2$ and $Q_4$ may be Type 2N4124.

The operation of the battery voltage detection and display apparatus of FIG. 1 will now be described with references to the middle horizontal line in the chart of FIG. 2. If the battery voltage is normal at slightly over 12 volts, the voltage at tap 20 is about 6 volts, and this is below the upper threshold voltage of 7 volts supplied to comparator $C_1$. Consequently, comparator $C_1$ produces a "hi" output which keeps signal-inverting transistor $Q_1$ "off" so that the vertical segments of display 40 are not energized. The 6 volts at tap 20 is also higher than the 5.7-volt lower threshold voltage applied to comparator $C_2$. Consequently, comparator $C_2$ produces a "hi" output which turns non-inverting transistor $Q_2$ "on" so that it energizes the middle horizontal segment 50 in the display 40 to represent with a dash the fact that the battery voltage has a normal value. At the same time, the "hi" output of comparator $C_2$ keeps signal-inverting transistor $Q_3$ "off" so it does not energize any of the segments of the display. The foregoing conditions as shown by the middle line in FIG. 2, obtain when the battery voltage at terminal 12 is in a normal range between about 12.0 volts and 14.7 volts.

If the battery voltage rises above 14.7 volts, and the voltage at tap 20 rises above 7 volts, the output of comparator $C_1$ becomes "lo" and signal-inverting transistor $Q_1$ is turned "on" to energize the vertical segments 34, 36, 44 and 46. The middle horizontal segment 50 remains energized by transistor $Q_2$. Therefore, the energized segments display the letter H representing a higher than normal battery voltage. The conditions are then as listed on the first line in FIG. 2.

The operation thus far described may be summarized as follows: When the input voltage is above the lower threshold, the output of comparator $C_2$ acts through transistor $Q_2$ to energize the middle horizontal segment to display a dash representing a normal condition. If the input voltage is above the upper threshold, the output of comparator $C_1$ acts through transistor $Q_1$ to energize the vertical segments to complete the display of an H representing a high condition.

If the battery voltage falls below about 12.0 volts and the voltage at tap 20 falls below about 5.7 volts, the output of comparator $C_2$ is made "lo", non-inverting transistor $Q_2$ is turned "off", and inverting transistor $Q_3$ is turned "on". Then, only the segments 44, 46 and 54 are energized (by transistor $Q_3$), and an "L" is dislayed to represent the fact that the battery voltage is lower than normal. The conditions are then as listed on the bottom line in FIG. 2.

By way of review, it may be noted that the horizontal segment 50 is energized by transistor $Q_2$ when the battery voltage is above a lower threshold, i.e., when the voltage is normal, and when it is higher than normal. The vertical segments of the display are energized by transistor $Q_1$ when the battery voltage is above the upper threshold voltage, i.e., higher than normal. Both of transistors $Q_2$ and $Q_1$ are operative in energizing an "H" on the display.

Figure 3:
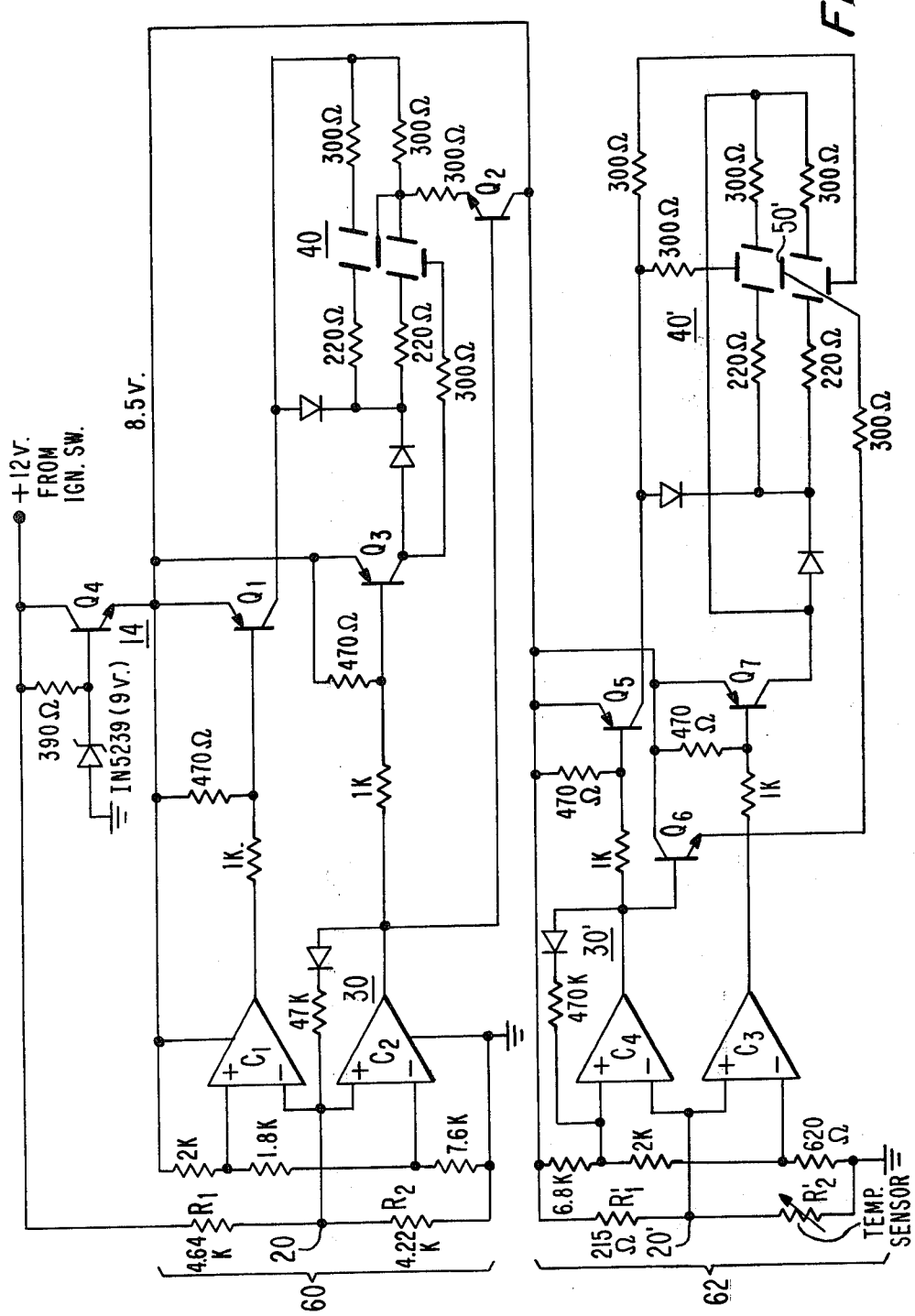
FIG. 3 is a circuit diagram of apparatus for displaying high, normal and low values of battery voltage, and hot, normal and cold values of temperature.

Reference is now made to FIG. 3 which shows a battery voltage detection and display apparatus 60, the same as is shown in FIG. 1, combined with an engine temperature detection and display apparatus 62. The four comparators $C_1$, $C_2$, $C_3$ and $C_4$ are all contained in a single Type CA339 integrated circuit unit. The single voltage regulator 14 supplies all circuits needing an 8.5-volt power supply. The temperature circuit 62 is the same as the battery voltage circuit described in connection with FIG. 1 except that the feedback circuit 30' is connected with the upper comparator $C_4$, and the input voltage divider $R_1'$ and $R_2'$ is supplied with 8.5 volts from the regulator 14, and the resistor $R_2'$ is a temperature-responsive resistor mounted on or in the block of the engine. The temperature sensor $R_2'$ may be any commercially-available unit having a resistance which varies inversely with temperature. It may, for example, have a resistance of 15 ohms when the temperature is at an upper threshold value of 240° F., and a resistance of 75 ohms when the temperature is at a lower threshold value of 140° F. Such a sensor may have a resistance of 150 ohms at a temperature of 75° F.

The temperature-indicating apparatus operates the same as the battery-voltage-indicating apparatus except that a normal temperature causes a signal voltage at 20' which enables comparator $C_4$ and transistor $Q_6$ to energize the horizontal segment 50' of display 40'. A higher than normal temperature cases a lower than normal voltage at tap 20' which enables comparator $C_3$ and transistor $Q_7$ to energize the vertical segments of display 40', so that an "H" is displayed representing "hot". A lower than normal temperature causes a higher than normal voltage at tap 20' which enables comparator $C_4$ and transistor $Q_5$ to energize all segments necessary to display a "C" representing "cold".

The combined voltage and temperature-indicating apparatus of FIG. 3 is economical to construct and install on an automobile because it requires only one quad comparator unit, seven transistors and two 7-segment display units, all of which are relatively inexpensive. The apparatus is very useful in providing a three-condition indication of battery voltage and engine temperature.

What is claimed is:

1. A high/normal/low three-condition detection and display means, comprising
    a first comparator receptive to an upper threshold voltage and to an input signal voltage representing a condition to be displayed,
    a second comparator receptive to said input signal voltage and to a lower threshold voltage,
    a seven-segment display,
    a first circuit coupled from the output of said first comparator to the vertical segments of said display, whereby to energize the vertical ones of the H-representing segments when the input signal voltage exceeds said upper threshold voltage,
    a second circuit coupled from the output of said second comparator to the middle horizontal segment of the display, whereby to energize the middle horizontal one of the H-representing segments when the input signal voltage is above the lower threshold voltage, and
    a third circuit coupled from the output of said second comparator to the L-representing segments of the display, whereby to energize the L-representing segments when the input signal voltage is below said lower threshold voltage.

2. The combination of claim 1 wherein said first and third circuits are the same and are different from said second circuit in providing outputs which are inverted relative to the output of said second circuit.

3. The combination of claim 1 wherein said first and third circuits are inverting circuits and said second circuit is a non-inverting circuit.

4. The combination of claim 1, and in addition, a feedback circuit for one of said comparators operative after the comparator is turned on to prevent the turning off of the comparator as the result of a slight decrease in received input signal.

5. The combination of claim 1, and in addition, a first voltage divider having taps connected to threshold voltage inputs of said comparators, a battery, and a voltage regulator connected to supply a constant voltage from said battery to said voltage divider and said comparators and said circuits.

6. The combination of claim 5, and in addition, a second voltage divider connected across said battery and having a tap connected to the signal voltage inputs of said comparators, whereby to detect and display a high voltage, a normal voltage or a low voltage across said battery.

7. The combination of claim 5, and in addition, a second voltage divider connected across the output of said voltage regulator and having a tap connected to the signal voltage inputs of said comparators, said second voltage divider including a temperature-responsive resistor, whereby to detect and display a high temperature, a normal temperature, or a low temperature of said resistor.

* * * * *